(12) United States Patent
Motsenbocker et al.

(10) Patent No.: US 12,132,124 B2
(45) Date of Patent: Oct. 29, 2024

(54) SEMICONDUCTOR BY-PASS SWITCH

(71) Applicants: Marvin Motsenbocker, Kamijima cho (JP); Xu Ming, Tianjin (CN)

(72) Inventors: Marvin Motsenbocker, Kamijima cho (JP); Xu Ming, Tianjin (CN)

(*) Notice: Subject to any disclaimer, the term of this patent is extended or adjusted under 35 U.S.C. 154(b) by 192 days.

(21) Appl. No.: 17/824,149

(22) Filed: May 25, 2022

(65) Prior Publication Data

US 2022/0393036 A1 Dec. 8, 2022

Related U.S. Application Data

(60) Provisional application No. 63/195,009, filed on May 29, 2021.

(51) Int. Cl.
| | | |
|---|---|---|
| *H01L 29/866* | (2006.01) | |
| *H01L 29/06* | (2006.01) | |
| *H01L 29/16* | (2006.01) | |
| *H01L 29/20* | (2006.01) | |
| *H01L 29/417* | (2006.01) | |
| *H01L 29/66* | (2006.01) | |
| *H01L 29/78* | (2006.01) | |
| *H02H 9/04* | (2006.01) | |

(52) U.S. Cl.
CPC .......... *H01L 29/866* (2013.01); *H01L 29/417* (2013.01); *H01L 29/6606* (2013.01); *H01L 29/66204* (2013.01); *H02H 9/041* (2013.01); *H01L 29/0649* (2013.01); *H01L 29/1608* (2013.01); *H01L 29/2003* (2013.01); *H01L 29/7815* (2013.01)

(58) Field of Classification Search
CPC ............. H01L 27/0255; H01L 29/0649; H01L 29/1608; H01L 29/2003; H01L 29/417; H01L 29/6606; H01L 29/66204; H01L 29/7397; H01L 29/7803; H01L 29/7804; H01L 29/7808; H01L 29/7811; H01L 29/7813; H01L 29/7815; H01L 29/866; H02H 9/041

See application file for complete search history.

(56) References Cited

U.S. PATENT DOCUMENTS

| | | | | |
|---|---|---|---|---|
| 5,602,046 | A * | 2/1997 | Calafut | H01L 27/0251 |
| | | | | 438/983 |
| 6,897,543 | B1* | 5/2005 | Huang | G11C 17/16 |
| | | | | 257/E21.666 |
| 10,492,282 | B2* | 11/2019 | Altamura | H01J 9/00 |
| 2010/0134176 | A1* | 6/2010 | Brandes | H01L 25/167 |
| | | | | 327/526 |
| 2017/0098705 | A1* | 4/2017 | Harrington, III | H01L 29/0696 |
| 2017/0179138 | A1* | 6/2017 | Hsu | H01L 27/1211 |
| 2021/0021151 | A1* | 1/2021 | Motsenbocker | H05B 45/14 |

FOREIGN PATENT DOCUMENTS

WO WO-2012144432 A1 * 10/2012 ......... H01L 23/5252

* cited by examiner

*Primary Examiner* — Jared Fureman
*Assistant Examiner* — Nicolas Bellido

(57) ABSTRACT

An anti-fuse having two electrical connections is constructed by adding at least one zener diode and resistor to a power MOSFET. When the voltage across the two electrical connections exceeds the zener diode voltage and the maximum gate voltage of the MOSFET, the MOSFET burns out. This shorts out the device which can be used to bypass an LED or other load when that load burns out and forms an open circuit.

19 Claims, 6 Drawing Sheets

SEMICONDUCTOR BY-PASS SWITCH

FIELD OF THE INVENTION

The invention relates to semiconductors and switches, and more particularly to automatic switches comprising semiconductors.

BACKGROUND

A major problem in the art of electronics that causes increased use of copper for wiring of devices such as multiple lights, heaters, motors and the like is the fact that when one device in a series string burns out, the entire string loses power. This is sometimes called the "Christmas tree light problem" because multiple lights often were used in series connection for Christmas trees. This problem is not limited to lighting but is also present in industrial processes where a number of devices are wired on a common circuit. For example an industrial process that takes place in a long heat tunnel may employ multiple electric heaters spaced along the tunnel. If one heater burns out, it is important that the others not stop so that the process may continue or be shut down more slowly. Presently such lights and devices often are wired in parallel because of this problem. But parallel wiring with two wires instead of one increases wiring costs, component costs and installation costs, compared to what a single wire series circuit offers.

The Christmas tree light problem has been addressed by many innovations over the years. See for example U.S. Pat. No. 10,492,282 issued to Altamura and others cited by Altamura. A major development in the lighting industry recently has been the use of multiple LED based light fixtures in applications such as office ceiling lighting and factory lighting. But each light usually is serviced by the same high voltage line and has its own voltage changer, which increases costs and decreases reliability. Being able to wire up such lights in series, can minimize copper costs, eliminate circuit redundancies and improve reliability of the light fixtures as described in U.S. Ser. No. 16/932,750.

DETAILED DESCRIPTION

Overall

Figure 1:
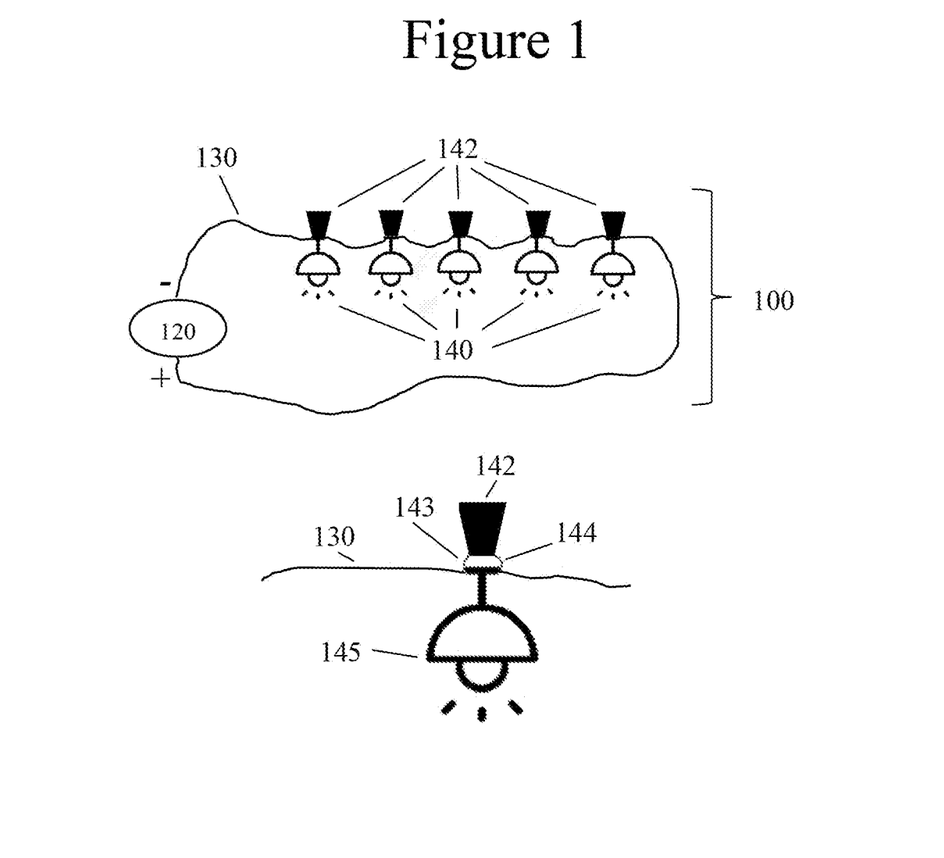
FIG. 1 shows a generalized use connection diagram for an embodiment.

Embodiments provide a circuit bypass device that allows the use of series wires to connect loads such as LED lighting fixtures, heaters and other loads used in industrial and non-industrial processes. FIG. 1 shows a series circuit 100 with a power source 120 feeding a long wire 130 having multiple lights 140 connected in series. Preferably power source 120 is constant current and accommodates load changes by decreasing voltage in response to fewer loads, and by increasing voltage in response to increased loads, while maintaining a constant current. Each light 140 in series circuit 100 has an anti-fuse 142 connected in parallel. The size of anti-fuse 142 is emphasized here but preferably is a small semiconductor that is mounted to the side of light 140 and normally is not seen. The anti-fuse 142 does not participate in the circuit when the attached light is operating. The light or other load draws a current and creates a small voltage drop (one fifth of the voltage output from power source 120 in this example). But if the light burns out and disconnects, thereby causing an opening the series circuit, the anti-fuse 142 at that light responds by forming a decreased resistance or even short, thereby allowing current to bypass the parallel connected light. This keeps the other lights on despite failure of one light in the chain.

A single light 145 is shown in the lower part of this figure, with anti-fuse 142 attached via two power leads, 143 and 144. Normally when light 145 is running, the voltage between power leads 143 and 144 is about one fifth the total voltage, which is shared by 5 lights. But when light 145 burns out, the voltage seen between power leads 143 and 144 rises to approximately the total voltage put out by power source 120. This is because anti-fuse 142 has a high impedance (typically higher than 50,000 ohms and preferably greater than 250,000 ohms and more preferably greater than 1 million ohms) and virtually all the voltage drop in the circuit is seen between these two power leads. Anti-fuse 142 responds by shorting out, thereby keeping the series connection intact.

The anti-fuse preferably is a circuit or semiconductor that responds to the parallel-attached light burnout by decreasing resistance between its two connections to the light. In a preferred embodiment the anti-fuse is a discrete semiconductor in a basic package having two pins for electrically connecting to the light. In a preferred embodiment the semiconductor shorts out and is one-use only. That is, the LED light fixture may include the semiconductor anti-fuse, which is discarded along with the LED light when the LED light or other series connected load burns out. In a preferred embodiment the anti-fuse is a two-lead semiconductor sold in a standard package such as TO-257. In an embodiment the anti-fuse has three leads and uses one output lead to activate a light or sound alert when the attached load burns out. The TO220 package is preferred for such 3 leaded device.

One Time Use Embodiment

The anti-fuse in this example gets triggered to short out or burn out to form a low resistance. In this embodiment the anti-fuse preferably is physically part of its parallel connected device and is discarded along with the device when the device fails and is replaced. For this application the anti-fuse automatically shorts a semiconductor device, preferably by asserting a high voltage that exceeds the rating of a junction of the semiconductor.

Defined Load Embodiment

Figure 2:
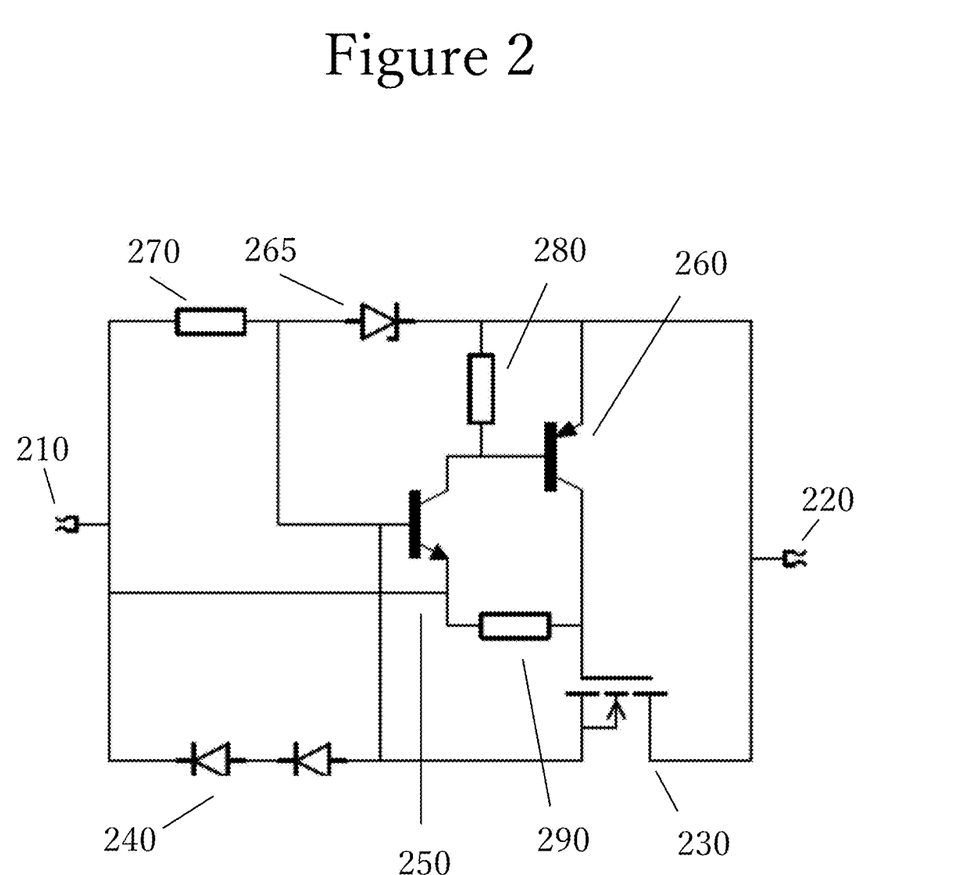
FIG. 2 shows a circuit that provides a defined voltage drop load for an embodiment.

In some applications however, it is desired to repeat the condition of increasing load upon high voltage triggering without destroying the anti-fuse. In an embodiment the semiconductor responds to a high voltage by forming a defined load such as a defined voltage drop. An example of this (with representative example parts) is shown in FIG. 2. This circuit has a negative voltage power connection 210 and a positive voltage power connection 220. MOSFET 230 (IRF740) is directly connected to the plus connection 220 at its drain and is connected to the minus connection 210 via diodes 240 (1N4004), which provide enough voltage drop to activate transistor 250 (AN42). This circuit latches the gate of MOSFET 230 with the collector of transistor 260 (AN94) to the drain of 230 in response to detection of an increase in voltage above the reverse voltage across Zener 265 (60V) by turning on transistor 260. This causes a constant voltage drop from 210 to 220, equal to the drop across diodes 240 and the threshold voltage of MOSFET 230. This circuit was tested with various N-MOSFET transistors, which showed increased voltage drop with higher voltage ratings because the threshold voltage increases with voltage rating generally. In practice, the reverse turn on voltage of Zener 265 is chosen to be higher than the voltage drop across the load (typically an LED light fixture) to which this circuit is coupled in parallel. Resister 270 is 47k ohms, resister 280 is 100k ohms and resister 290 is 10k ohms in this example.

Although this embodiment was carried out using an N-MOSFET (which is preferred) a skilled artisan can readily replace this with a P-MOSFET by adjusting connections appropriately. Examples throughout this disclosure are based on N-MOSFET for convenience but the claims broadly include P-MOSFET embodiments as well as embodiments made from IGBT, SiC and GaN transistors, as will be appreciated by a skilled semiconductor engineer with at least one year experience developing semiconductor power switching circuitry.

Use as a Governor

In an embodiment the anti-fuse is connected to a device such as a motor or generator and regulates voltage applied to/from the device for protection as a defined load. This is most helpful for a regenerative circuit such as a motor used in an electric bike or other vehicle used for regenerative braking. In practice, the faster the motor (used either as a motor or as a generator to recycle braking energy) turns, the higher the voltage. The anti-fuse is connected in parallel and absorbs energy above a voltage threshold in order to protect the motor/generator from burnout or to put a limit on rotation speed. In the example of FIG. 2, diodes 240 are removed so that the MOSFET 230 source pin is connected directly to the 210 minus connection. The base of transistor 250 shown in FIG. 2 is disconnected from the MOSFET 230 source pin. By doing this, the anti-fuse automatically resets itself to allow repeated operation. In an embodiment this circuit is used in a two terminal device attached to an electrical motor to protect the motor from overvoltage or over speed conditions. In an embodiment instead of shorting out the power the circuit connects a power absorber such as a capacitor to absorb energy during high speed conditions.

Monolithic Semiconductor Embodiment

In order to support the high currents required, VDMOS and other transistors typically are constructed as multiple parallel connected source and body regions and corresponding gate electrodes, typically arranged in "stripes," or as an array of cells with the "core" active region of the device. Recently, trenched versions of these have become extremely popular, are most conveniently modified, and are exemplified in this disclosure. N-MOSFET terminology is used throughout this disclosure for convenience although a skilled artisan will readily appreciate alterations needed for the P-MOSFET, IGBT, SiC and GaN embodiments, which are not shown for brevity.

Key Point

In a desirable embodiment, the gate of a MOSFET or analogous transistor is connected via a resistor to ground (0 volt minus lead) and also via a diode connection such as multiple Zener diodes to the plus lead. In this way, when a high voltage that exceeds the Zener diode conduction voltage appears between the minus and plus leads, the excess voltage (above the Zener voltage) is applied to the gate. If high enough, this destroys the device, which routinely was found to short out and provide the anti-fusing effect. A key point for an embodiment in this disclosure is the convenient and low cost incorporation of such resistance and diode voltage drops into a power semiconductor, which then becomes a semiconductor anti-fuse.

On Chip Resistor and Diode Fabrication

Many types of resistors may be built on wafers, the most common of which are the: 1) diffused resistors; 2) ion-implanted resistors; 3) thin-film resistors; and 4) polysilicon resistors. For use with MOSFETs and particularly trench N-MOSFETs designed to switch high current levels, it is preferred to add a resistor between the gate and the source during the gate formation step. Preferably the resistor is added on top of the insulator, such as silicon oxide, used to insulate the gate, and one end of the resistor contacts the gate. In an embodiment the gate comprises polysilicon and the resistor is made of the same polysilicon as the gate and continuous with the gate during the gate formation step, but in a configuration (thickness, depth, doping etc.) that adds the desired resistance between the gate and source.

Figure 3:
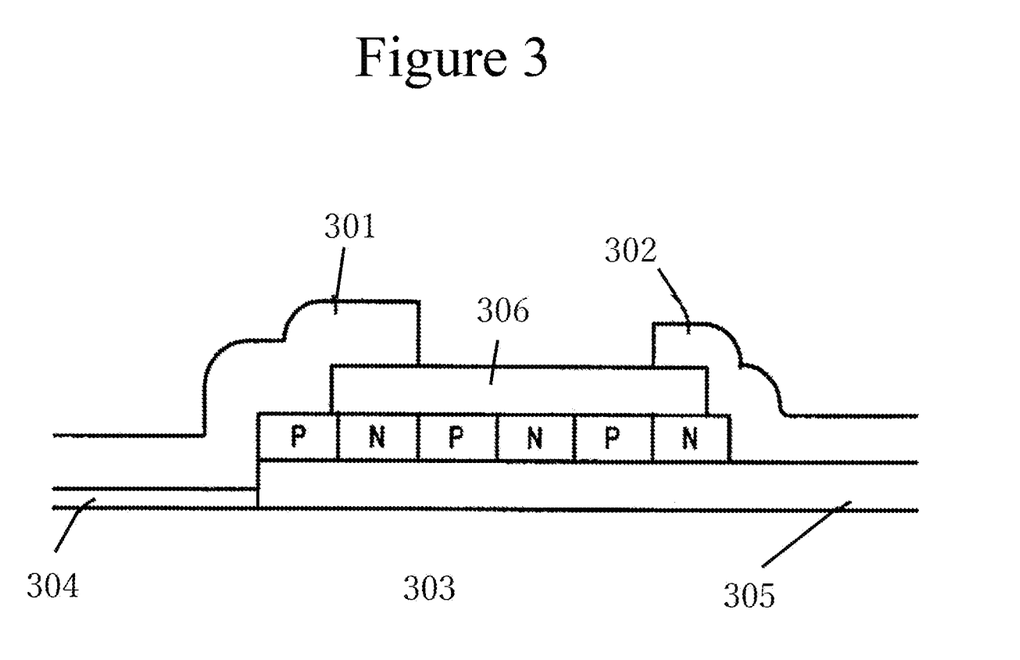
FIG. 3 is an outline of a semiconductor device according to an embodiment.

FIG. 3 shows a common design wherein metal or highly doped conductive elements 301 and 302 terminate a series of N-P polysilicon doped regions 306 that are insulated from an underlying N-epitaxial region 303 that is often used as a conductor to a drain region. Here a thick silicon oxide or other insulator 305 insulates underneath 306, which acts as a voltage sensor. Conductive element 301 may electrically connect to a drain voltage via a field plate, in which case section 304 is an insulator such as silicon oxide. In an embodiment conductive element 301 connects to epitaxial region 303, preferably next to or in contact with a highly doped N+ vertical pillar to increase conductivity. In this case section 304 is conducting material such as highly doped N+ and preferably continuous with element 301.

Many types of diodes may be built, depending on the type of transistor being used and the fabrication material. Generally, to get a large voltage drop of greater than 25 volts, one or more zener diode junctions are made, again preferably during the step of gate (or emitter) formation or formation of other surface components. For a sharp voltage cutoff, a high dopant concentration is used for the PN junction. Multiple junctions for higher series voltages are easily made by multiple PN junctions formed along a conductive strip such as a highly doped N+ material as shown in FIG. 3. The PN region here may be conveniently manufactured as separate stripes of P segments doped into a continuous N region, as will be shown in FIG. 4.

Figure 4:
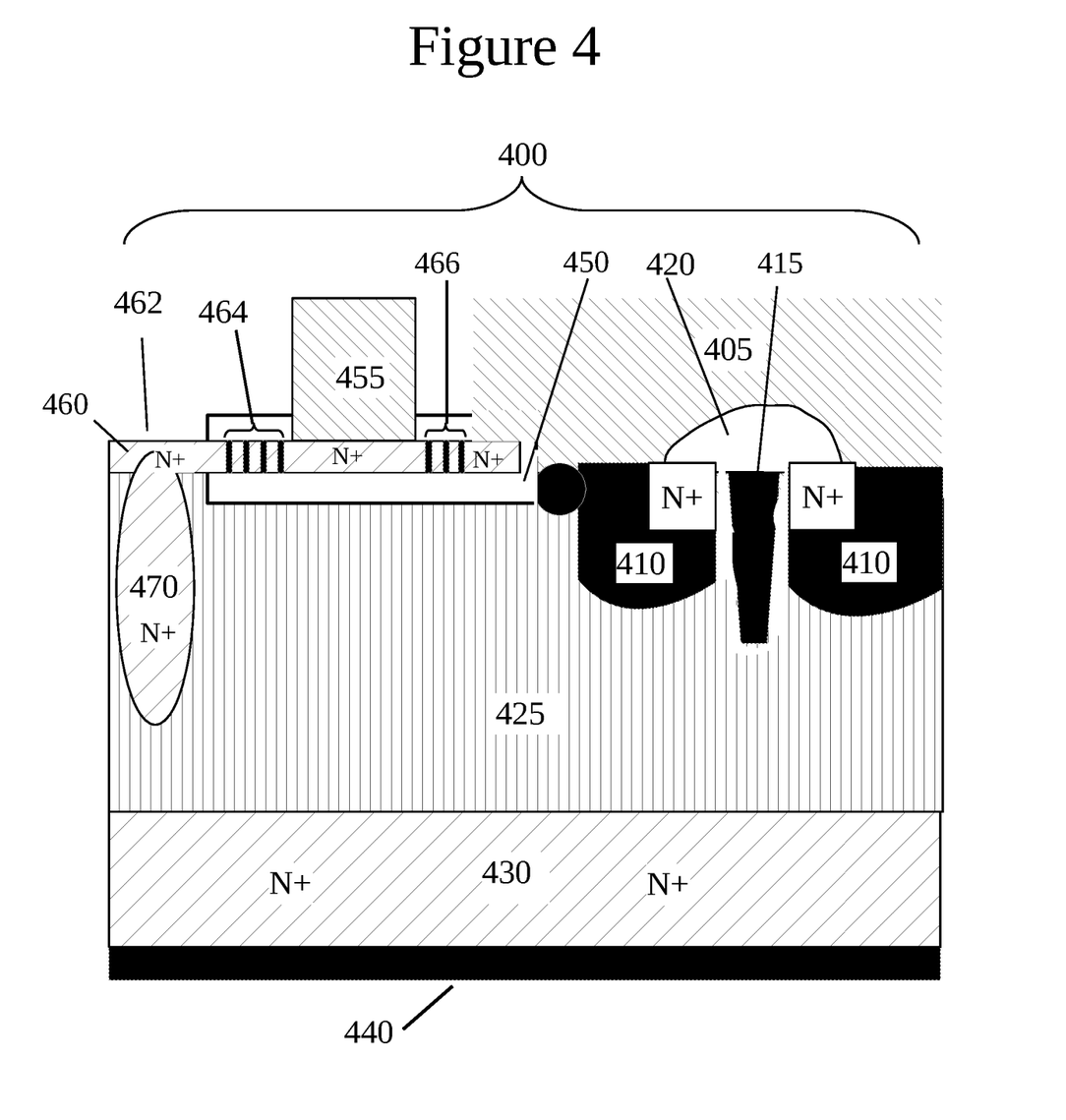
FIG. 4 is a cross section view of a semiconductor device according to an embodiment.

N-VDMOS example FIG. 4 is a cross section view of a desirable embodiment based on a trench type N MOSFET. A skilled artisan will readily appreciate how to implement embodiments in a variety of trench structures as well as non trenched such as DDMOS transistors, IGBTs, SiC and GaN. Device 400 in FIG. 4 includes source connection 405, P body 410 structures shown in black and vertical gate 415 channel shown in black. Insulator (preferably SiO2 for silicon based MOSFET switching) 420 is shown in white. Part of the insulator 450 is built on N epitaxial layer 425, which is grown on highly doped conduction N+ layer 430. The bottom side of layer 430 is covered by metal plate drain electrode 440.

In this embodiment thick oxide insulator 450 on epitaxial layer 425 extends from source connection 405 laterally and preferably in the same plane or contiguous with the insulation under the gate pad 455 as is known for N-MOSFET transistor construction. In an embodiment this insulation is thinner than typical insulation under the gate electrode, and may be less than 500 angstroms thick, and more preferably less than 300 angstroms thick. To make the device more sensitive a thickness less than 250 angstroms may be desirable. In another embodiment the insulation (shown as white surround in the drawing) around vertical gate 415 is thinner than the insulation under gate pad 455, to enhance destruction shorting out of the device upon triggering.

Source to Drain Connection

Conduction segment 460 in the embodiment of an N-MOSFET switch as shown here preferably comprises a highly+doped N layer. In an embodiment, electrical conductivity between drain electrode 440 and segment 460 is made by relying on the natural electron conductivity along the periphery of the semiconductor of which device is made. This is because electrons travel through the epitaxial layer and through the highly doped layer overlying electrode 440 to this electrode. In a preferred embodiment a field plate surrounds active components of the device and segment 460 electrically connects directly or indirectly to an area outside the perimeter of the field plate.

In an embodiment shown in FIG. 4, however, a highly doped region 470 can further increase this conductivity from the bottom drain electrode 440 up through epitaxial layer 425. Preferably, doping of vertical conductor 470 when used, occurs in stages during epitaxial growth of layer 425. Conductor 470 may extend from segment 460 into region 430 (not shown) In another embodiment not shown here a separate metal drain electrode connects to segment 460 directly.

Diode(s) Between Drain and Gate, Resistor(s) Between Gate and Source

Conduction segment 460 in the example of an N-MOSFET based switch connects source 405 with gate 455 having a cross-section shown in this figure, in the horizontal plane, and drain 440 as shown in FIG. 4. Most, or even all of the bottom of this doped conductive region is positioned on top of insulator 450. On the right side of segment 460 as shown in this figure, multiple resistor segments 466 are prepared by lithography in a layer as shown in FIG. 4 to create a resistance between this source connection and the horizontal plane gate connection. On the left side of segment 460 as shown are multiple diode segments 464, which act as a voltage sensor. These typically are made by ion implantation of p regions shown here as black vertical sections. A variety of PN diodes may be used in series on a side of the semiconductor as shown, opposite drain connection 440 as shown. Forward conducting diodes with approximately 0.6 V drop may be combined with reverse bias connected Zener diode junctions of typically 16 V or more.

In a preferred embodiment the entire voltage drop across these diodes from the right side to the left side of section 464 is at least 25 volts. This allows the condition wherein no current flows through segment 460 from source to gate until at least 25 volts is applied across diodes 464 (taking into account voltage losses in the rest of the circuit between source 405 and drain 440). As a result, during operation of the completed device after connection in parallel with a load such as an LED light, significant electron flow into gate junction 455 does not occur as long as the voltage drop through the parallel connected load is less than 25 volts. In a preferred embodiment the multiple diode segments total voltage drop is more than 50 volts or even more than 100 volts, for use in higher voltage circuits wherein the parallel connected load presents a less than 50 volts, or less than 100 volts respectively voltage drop to the powered circuit.

In practice an additional gate threshold voltage of about 20 volts plus is normally added to the diode voltage drop when calculating this threshold voltage. This is because operation of this embodiment requires an abnormally high voltage between source (at zero voltage potential) and the gate sufficient to destroy the gate by exceeding its maximum voltage level, causing fusing of the semiconductor and operation of this negative fuse. In other words, in order to cause a conduction, or relative short between source and drain, a significantly high voltage is needed between source and gate to destroy the transistor junction. For example if the maximum gate to source voltage is 20 volts, it is preferred to assert at least 30 volts and preferably at least 50 volts onto the gate when the parallel load burns out, which causes a high voltage drop across the anti-fuse device.

A minimum resistance is needed in section 466 to establish a high voltage at gate junction 455. This resistance should be a high proportion of the circuit resistance from source to drain in order to allow sufficient voltage to destroy the transistor junction yet should be low enough to allow sufficient current flow into the gate junction 455. In experiments done with a discrete VDMOS transistor type IRFP264 using a 60 volt Zener in place of section 464 the following data were obtained with a 200 volt DC power supplied between source and drain of the transistor. (S, D and G denote source, drain and gate respectively in this table). In this experiment the device, (made from a transistor, G to S connected resistor (comparing 4 resistor values), and 60V Zener connected between S and D) was connected in parallel with a 50 volt 1 amp LED light fixture in series with 3 other light fixtures, connected to a 200 volt 1 amp constant current power supply. Activation of the anti-fuse was carried out by disconnecting the parallel LED light fixture to simulate its burnout. Upon burnout, the remaining 3 LED lights connected in series remained on upon blowing out the IRFP264 transistor.

| Resistance S to G | Resistance between S to D after triggering the anti-fuse |
|---|---|
| 10,000 | 17 ohms |
| 33,000 | 3.8 ohms |
| 100,000 | 113 ohms |
| 300,000 | 186,000 ohms (lights did not remain on) |

These results indicate that the specific usable resistance needed between source and gate is flexible and worked well over a wide range from at least 100 kilo ohms to 10 kilo ohms in this case. This allows flexibility in the doping process when adding resistance 466 to conduction segment 460. In the case of manufacture of a monolithic device described here and exemplified in FIG. 4, attention must be paid to the resistance between conduction segment 460 and drain 440. This should be minimized and preferably is less than the resistance of section 466. However, because operation of the device is a destructive process that can respond to a wide range of voltages, it is clear that a variety of conduction paths from conduction segment 460 to drain 440 can be used. In some cases there will be enough conduction from drain 440 through doped region 430 and poorly conducting epitaxial region 425 (without additional conduction path such as doped vertical section 470) because epitaxial region 425 is so large.

Other Silicon Devices

Because the response time required for operation of the monolithic device is slow, a variety of MOSFET technologies are useful for embodiments. Low cost VMOS, and planer VMOS technologies are suited because the additional features of reactive ion etching and oxidation of the silicon trench gate, polysilicon fill and recessed etchback, unit cell and distributed voltage clamping to protect the trench gate, and scaling active cells to yet higher densities using deep submicron fabrication are not necessarily required, nor are the expensive and increasingly complex fabrication facilities. Embodiments of the monolithic device do not require gate-engineered trench VDMOS improved high-frequency switching capability with lower gate charge utilizing non-uniform gate oxides, field shaping, and charge balancing that are often used in more expensive superjunction RSO methods.

A major advantage of the monolithic semiconductor embodiment is that old semiconductor fabrication facilities built and paid for older technologies can be used for making the device. In particular low tolerance steps such as deposition of polysilicon to make resistors of fairly low tolerance (eg. 30% reproducibility), and doping for Zener junctions of low tolerance (eg. 30% reproducibility) can be used. Thus, an embodiment is a low cost, low tolerance process for making silicon switches having low precision resistors and diodes added, preferably to the gate formation step and preferably on top of a gate insulation layer, for convenience in manufacture.

Connecting the Drain to the Diodes in the Top Surface

FIG. 4 shows highly doped vertical conductor 470 under portion 462 of conductor 460. This provides voltage to gate 455 when the voltage between source and drain is enough to cause sufficient current flow through diodes 464, which trigger the device to destruction via excess voltage applied to gate 455. Many other ways are possible to connect diodes 464 to the drain and the exemplified simple structure shown in FIG. 4 generally is organized in large arrays of hundreds or thousands to increase current handling.

In a preferred embodiment electrons flow to drain 440 primarily via doped conductive layer 430 and lightly conductive epitaxial layer 425. But other methods that tap into the voltage of the drain can be used that take advantage of the high drain voltage potential appearing at the surface of the device. This is because the epitaxial layer is in contact with the drain via the highly doped N+ layer, and the epitaxial layer extends up to the surface at many locations in embodiments. In many embodiments the surface periphery high voltage may be used. This is possible because the device is designed for destruction when it is activated and structures designed to protect against high voltage may be modified more easily compared to a device that is designed to not break down.

Figure 5:
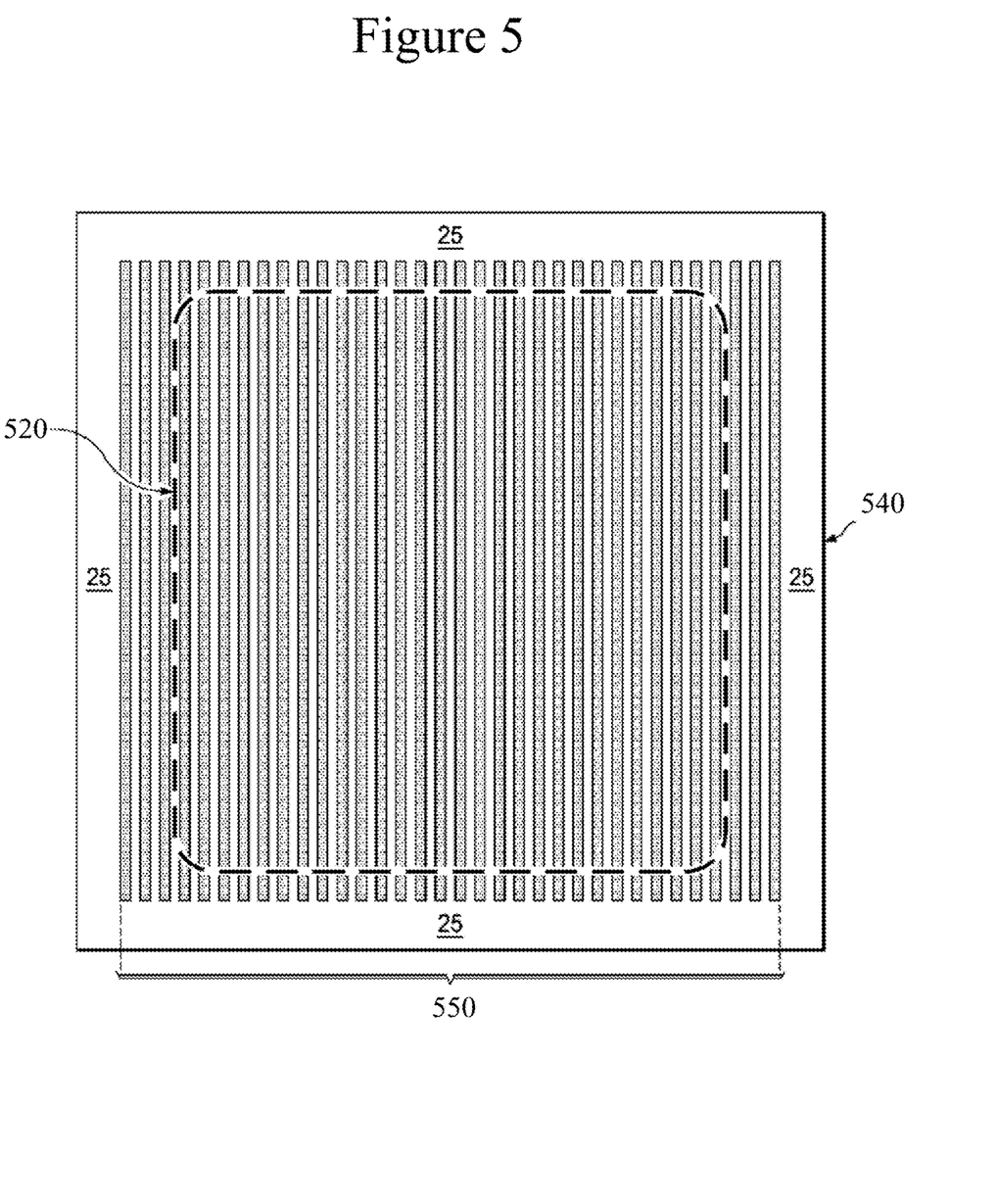
FIG. 5 is a top view of a device embodiment.

In this context consider that the finished device (in the example of an N-MOSFET) has a core region and peripheral region wherein the surface potential around the peripheral edges is near the high voltage potential of the drain. FIG. 5 is a top view of a VDMOS device 540 having p-type pillars 550 in the form of parallel "stripes" extending across the interior of the die at which VDMOS 20 is formed. In this superjunction case, p-type pillars 550 are formed into and along with an n-type epitaxial layer in which the n-type epitaxial material is present at or near the surface between the p-type pillars 550. In other embodiments p-type pillars and/or other corresponding elements of the transistors may be arranged as an array of cells, often in a hex formation. These components generally extend into the n-type epitaxial region under the gates and along with n+ source regions are formed within a central region of the die, hereinafter referred to as "core" region depicted as region 520 in FIG. 5. Core region 520 is the active portion of device 540.

In contrast, "active region" means the region of the circuit die that passes source to drain current in the on-state for this MOSFET embodiment. An electric field in this core will be oriented vertically. However the top outer edge of the integrated circuit will also be at or near the voltage applied to the substrate (the drain terminal, which in FIG. 4 is at the bottom). A considerable portion of research and development is dedicated to ameliorating the high voltage limiting effects of these edges. Termination structures such as field plates, doped regions, insulator films and conductors at the edges of the termination region are used to lower the overall electric fields in termination region 25 and protect from avalanche breakdown.

In an embodiment the undesirable outer edge voltage effect is used to provide a common drain connection for triggering gate destruction for anti-fuse operation of the device. In this case, the edges can be connected to get the necessary+voltage from the drain, preferably by a polysilicon electrode, or a highly doped region at one or more peripheral locations 25 as shown. This high voltage periphery may have a connection via a conducting material to bring the high voltage from the periphery selectively to particular portions of the chip where the voltage is needed. When using this configuration one or more resistors or diode-voltage drops may be used between the high voltage outer portion and the interior active region. See US No. 2017/0098705A1 "Termination Region Architecture for Vertical Power Transistors" by Harrington III et al. and U.S. Pat. No. 5,602,046 "Integrated Zener Diode Protection Structures and Fabrication Methods for DMOS Power Devices" by Calafut et al., which describe alternative structures for organizing one or more field plates to which a Zener diode may be attached in a fabricated power chip. The structures, materials and related processes for making and using field plates and Zener diodes recited in these two documents are particularly incorporated by reference and are not repeated here for brevity.

In an embodiment one or more parallel field plates are used in a configuration having less shielding protection that usual in view of the fact that the devices described herein are designed to be destroyed by excessive voltage. The anti-fuse generally needs to resist the lower voltages experienced during normal operation when placed in parallel connection with another load on a high voltage circuit. The only time the anti-fuse will see the full voltage is when the anti-fuse must destruct from that high voltage to carry out its mission in life. Accordingly, the field plate (or other protective structure) only needs to protect from the lower voltages such as 25 v, 50 v or 100 volts during operation in parallel with a load such as an LED light. When that voltage goes up, we want the device to destruct.

In an embodiment the core region of the device is protected by a thin insulator such as silicon oxide. The non-core surrounds, shown as termination region 25 are generally protected by a thicker insulator.

Field plates often comprise a metal plate and/or a polymeric silicon conductive plate connected to the gate or source voltage to lower the electric field at their peripheral location. Preferably, immediately outside this and further in the edges of the dye is a high voltage drain-connected metal conductor that may extend contiguously on one or more sides of the core region 520. This may extend from the die perimeter into the termination region 25 overlying the thick insulation that covers the termination region. This metal conductor may be used to supply a drain connection to the device. Adding a functional connection to this high voltage conductor partly defeats the purpose of a field plate, but is consistent with the function of the anti-fuse, which is designed to fail upon application of a high voltage. During normal use in parallel with a load presenting a low voltage drop of typically 25-50 volts, protection from the field plate is not as needed. And, if the load opens up, which presents the high value, full series circuit voltage to the semiconductor device, the device is supposed to respond by breaking down and fusing the junctions between the source and drain. In this respect a normal high voltage protect field plate is not needed, and if present, could be modified in performance by using it for a second purpose of supplying high voltage to a portion of the core from the outlying high voltage connection.

Analogous conductive layers or regions may be made for devices made from GaN and SiC as a skilled artisan in device fabrication of those devices readily will appreciate. In an embodiment one or more drain electrodes may be laid down on the top surface and electrically connected this way.

Simple Manufacturing

Figure 6:
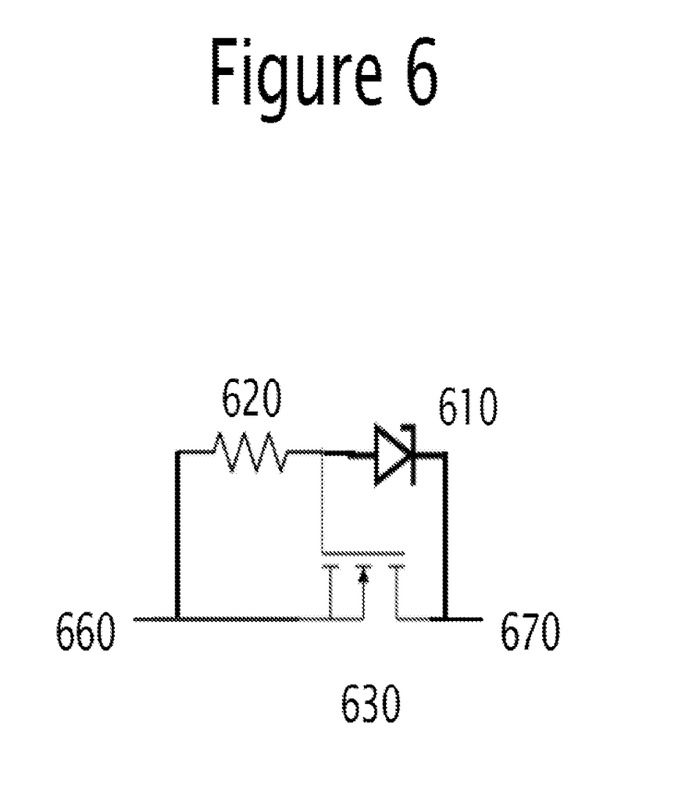
FIG. 6 is a schematic for further embodiments.

Embodiments utilize existing processes for manufacturing with minimal alterations and additions to carry out implementation of the structure of adding a Zener diode 610 element(s) and resistor 620 to a transistor such as MOSFET 630 shown in FIG. 6.

The resistor and diode elements preferably are added to the top side of a vertical DMOS and should be made in the same steps that generate the gate electrodes and insulation layers. The connection to the drain, on an opposite end of the semiconductor can be enhanced by altering the epitaxial layer growth by implanting high dopant vertical channels under the Zener diode elements to allow electron flow from the Zener diode vertically to the drain. Alternatively, as described above, a field plate, doped region or the like, having a high drain voltage can be connected to the added diodes. This latter option is surprisingly available because the risk of avalanche over voltage is lower than usual due to the device only requiring resistance up to the voltage drop of the attached load that it protects. Furthermore, avalanche breakdown is desired at slightly higher voltages as this, and normal operation requires such sensitivity to high voltage.

With these factors in mind, the following procedural steps are provided as a representative example for manufacturing.
1. providing an N+ type wafer with nominal arsenic doping of about $10^{19}$ cm$^{-3}$
2. growing epitaxially an N− layer with P doping of $10^{16}$ cm$^{-3}$
3. field oxidation to form a thick oxide layer, followed by active lithology and oxide etching to define the device area
4. gate oxidation, polysilicon deposition, doping anneal, gate lithography, and polyetching to form a gate pattern of hexagon-mesh, wherein resistor segments connect each gate to a source and diodes connect each gate to a drain region
5. self-aligned implantation of arsenic and anneal to form N+ source
6. lateral diffusion difference of the p-body and n+ to form a controlled channel length along the Si surface
7. masked high dose boron implantation to form P+ region in the p-body to enhance body contact
8. thick inter-level oxide deposition of TEOS, then contact lithography, and oxide etching to form the contact windows
9. metallization covering the chip surface and form butting source-body contacts for the VDMOS In a preferred embodiment insulation such as silicon oxide that insulates the interior of the gate trench regions is made thinner and has a lower resistance to high voltage than insulation of the gate electrodes. Preferably the gate trench insulation is at least 20% thinner and more preferably is at least 50% thinner. This ensures that high voltage from conductivity of the diodes destroys the trenches in the epitaxial region preferentially, leading to stronger destruction and fusing of the device.

Of course, the structure shown in FIG. 6 can be still implemented into a two terminal semiconductor device with minus terminal 660 and plus terminal 670 under a variety of configurations. For example, a discrete Zener diode 610 can be added between the gate of a MOSFET and the plus terminal 670 before or during encapsulation. In this case, a resistance 620 can be added between the negative terminal and gate on the semiconductor substrate itself or can also be an added discrete component added during packaging. This can allow simpler manufacturing that requires less alteration to an existing transistor manufacturing line.

Because the source connection of a VDMOS device is on the opposite side of the gate and drain regions it is particularly desirable to use an external Zener diode to connect the source to the gate, while optionally modifying the manufacturing process to add conductivity between the drain and gate by adding resistor 620 on the chip surface. Thus a relevant manufacturing technique would involve connecting a Zener diode as shown in FIG. 6 between the large back plate minus source electrode and a point(s) on the opposite surface to the gate. This might be done by automated process immediately prior to encapsulation itself. A resistor can be added at this state too.

It is of course contemplated that skilled artisans having reference to this specification can readily adapt these embodiments to alternative types of power devices such as trench gate VDMOS transistors, IGBTs, GaN transistors and SiC transistors without undue experimentation. The claims are not limited to the specific examples herein but include variations that a skilled artisan can fashion based on learning this disclosure.

We claim:

1. A semiconductor anti-fuse device, comprising:
a semiconductor substrate;
at least two power leads electrically connected to the semiconductor substrate;
a voltage sensor integrated with the semiconductor substrate; and
a semiconductor junction that is electrically connected to the voltage sensor; wherein
upon detection of a voltage that exceeds a threshold by the voltage sensor, the semiconductor junction is destroyed by application of a large voltage to the semiconductor junction, which shorts out the semiconductor junction between the at least two power connections.

2. The device of claim 1, wherein the voltage sensor comprises a resistor portion and a diode portion and wherein the semiconductor junction is part of a transistor portion integrally formed with the semiconductor substrate, wherein the resistor portion and the diode portion are electrically joined to each other in a first connection.

3. The device of claim 2, wherein the first connection is electrically coupled to a gate of the transistor portion.

4. The device of claim 2, wherein the resistor portion comprises polysilicon on silicon oxide at a layer of the semiconductor substrate in a common plane as a grid electrode on the semiconductor substrate.

5. The device of claim 2, where the diode portion comprises at least two Zener diodes connected in series on a side of the semiconductor substrate opposite to a drain connection.

6. The device of claim 1 having only two power leads, comprising a plus power lead and a minus power lead.

7. The device of claim 6, wherein the plus power lead is electrically connected to one end of the diode portion and the minus power lead is electrically connected to one end of the resistor portion.

8. The device of claim 7, wherein the semiconductor portion comprises a transistor having a drain on the backside of the semiconductor substrate and wherein the drain is connected to the plus power lead.

9. The device of claim 8, where the transistor is a MOSFET having a defined gate to source maximum value and the diode portion comprises multiple diodes formed on the semiconductor portion in series voltage that exceeds 40 volts.

10. The device of claim 9, wherein the diode portion is connected between the gate and a drain of the MOSFET.

11. The device of claim 8, wherein the drain is electrically connected to the diode portion through a N+ layer over the drain region.

12. The device of claim 11, wherein at least one edge of the semiconductor is electrically connected to the backside drain and the at least one edge is electrically connected to the diode portion on a side opposite the backside.

13. The device of claim 8, wherein the drain is electrically connected to the diode portion via one or more doped vertical pillars that penetrate an epitaxial layer of the semiconductor from a face opposite the drain region.

14. A direct current light fixture comprising a light, two power connections that provide power to the light, and the device of claim 6, wherein the device is electrically connected in parallel with the two power connections in a manner that when the light burns out, the device is triggered to short out and allow current to flow from one power connection to the other.

15. An electrical heater for an industrial process, comprising an electric heater, two power connections that provide power to the heater, and the device of claim 6, wherein the device is electrically connected in parallel with the two power connections in a manner that when the heater burns out, the device is triggered to short out and allow current to flow from one power connection to the other.

16. The electrical heater of claim 15, further comprising at least one light or noise alarm that is triggered to emit light or noise respectively when the heater burns out.

17. The device of claim 1, wherein the semiconductor junction comprises a MOSFET, SiC MOSFET or GaN transistor.

18. A semiconductor anti-fuse device, comprising:
a transistor semiconductor substrate:
multiple gate or emitter trenches connected in parallel; and
two power leads electrically connected to the semiconductor substrate capable of handling a high voltage;
wherein the gate or emitter trenches are insulated by an insulation layer having a first thickness;
the gate or emitter electrodes connected to the gate or emitter trenches are insulated by an insulation layer having a second thickness; and
wherein the second thickness is more than 50% greater than the size of the first thickness such that
application of a high voltage to the gate or emitter causes preferential destruction in the trench portion of the gate or emitter trenches causing shorting of the semiconductor substrate between the two power leads.

19. The semiconductor anti-fuse device of claim 18, further comprising a diode chain having a threshold conduction voltage that is electrically connected to the semiconductor junction; wherein
upon application of a voltage that exceeds the threshold conduction voltage, the semiconductor junction is destroyed by application of a large electrical pulse, which shorts out the trench portion of the gate or emitter trenches.

* * * * *